United States Patent
Nakazawa et al.

(10) Patent No.: US 10,347,690 B2
(45) Date of Patent: Jul. 9, 2019

(54) SEMICONDUCTOR MEMORY DEVICE WITH EFFICIENT INCLUSION OF CONTROL CIRCUITS

(71) Applicant: TOSHIBA MEMORY CORPORATION, Tokyo (JP)

(72) Inventors: Shingo Nakazawa, Kanagawa (JP); Tsuneo Inaba, Kanagawa (JP); Hiroyuki Takenaka, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/905,256

(22) Filed: Feb. 26, 2018

(65) Prior Publication Data
US 2019/0081101 A1  Mar. 14, 2019

(30) Foreign Application Priority Data
Sep. 13, 2017  (JP) .................. 2017-176073

(51) Int. Cl.
    *H01L 27/22* (2006.01)
    *H01L 27/24* (2006.01)
    *G11C 13/00* (2006.01)

(52) U.S. Cl.
    CPC ........ *H01L 27/222* (2013.01); *G11C 13/0004* (2013.01); *H01L 27/2481* (2013.01); *G11C 2213/71* (2013.01); *G11C 2213/81* (2013.01)

(58) Field of Classification Search
    CPC ............... H01L 27/2481; H01L 27/222; G11C 13/0004; G11C 2213/71; G11C 2213/81
    See application file for complete search history.

(56) References Cited

U.S. PATENT DOCUMENTS

| 7,986,545 | B2* | 7/2011 | Yoon ........................ G11C 5/02 365/105 |
| 8,036,010 | B2 | 10/2011 | Maejima |
| 8,253,196 | B2* | 8/2012 | Lotfi ................. H01L 21/28518 257/334 |
| 8,391,047 | B2* | 3/2013 | Maejima ............ G11C 13/0004 365/148 |
| 9,196,362 | B2 | 11/2015 | Siau et al. |
| 2007/0132049 | A1* | 6/2007 | Stipe .................. G11C 13/0007 257/421 |
| 2013/0094273 | A1 | 4/2013 | Chien et al. |

FOREIGN PATENT DOCUMENTS

JP  4709868 B2  6/2011

* cited by examiner

*Primary Examiner* — Vanthu T Nguyen
(74) *Attorney, Agent, or Firm* — Kim & Stewart LLP

(57) ABSTRACT

A semiconductor memory device includes memory cell arrays that include a plurality of memory cells. A first control circuit with control transistors of a first conductivity type is in a first region below the memory cell arrays. A second control circuit includes a first transistor of a first conductivity type connected in parallel to a second transistor of a second conductivity type. One of the first and second transistors is connected to an end of at least one control transistor. The second control circuit delivers a voltage to the plurality of control transistors. The first transistor is disposed in the first region. The second transistor is disposed in a second region adjacent to the first region. The second region is below a gap between adjacent memory cell arrays.

16 Claims, 7 Drawing Sheets

SEMICONDUCTOR MEMORY DEVICE WITH EFFICIENT INCLUSION OF CONTROL CIRCUITS

CROSS-REFERENCE TO RELATED APPLICATION

This application is based upon and claims the benefit of priority from Japanese Patent Application No. 2017-176073, filed Sep. 13, 2017, the entire contents of which are incorporated herein by reference.

FIELD

An embodiment described herein relates generally to a semiconductor memory device.

BACKGROUND

In recent years, variable resistance memory has been considered as a successor candidate to flash memory. Variable resistance memory includes resistance change memory (e.g., ReRAM: Resistive RAM), which store value states in a nonvolatile manner as differences in resistance values in transition metal oxides used as recording layers, and phase change memory (e.g., PCRAMs: Phase Change RAMs), which use a chalcogenide or the like as recording layers for storing value states as different material states/phases, such as a crystalline state (conductor) and an amorphous state (insulator).

In such semiconductor memory, bit lines of memory cell arrays are connected to column-system control circuits including bit line selectors, sense amplifiers, or the like. Word lines of the memory cell arrays are connected to row-system control circuits including row decoders, word line drivers, or the like. To minimize chip areas the necessary control circuits must be incorporated in an efficient manner, such as below the memory cell arrays.

DETAILED DESCRIPTION

Figure 1:
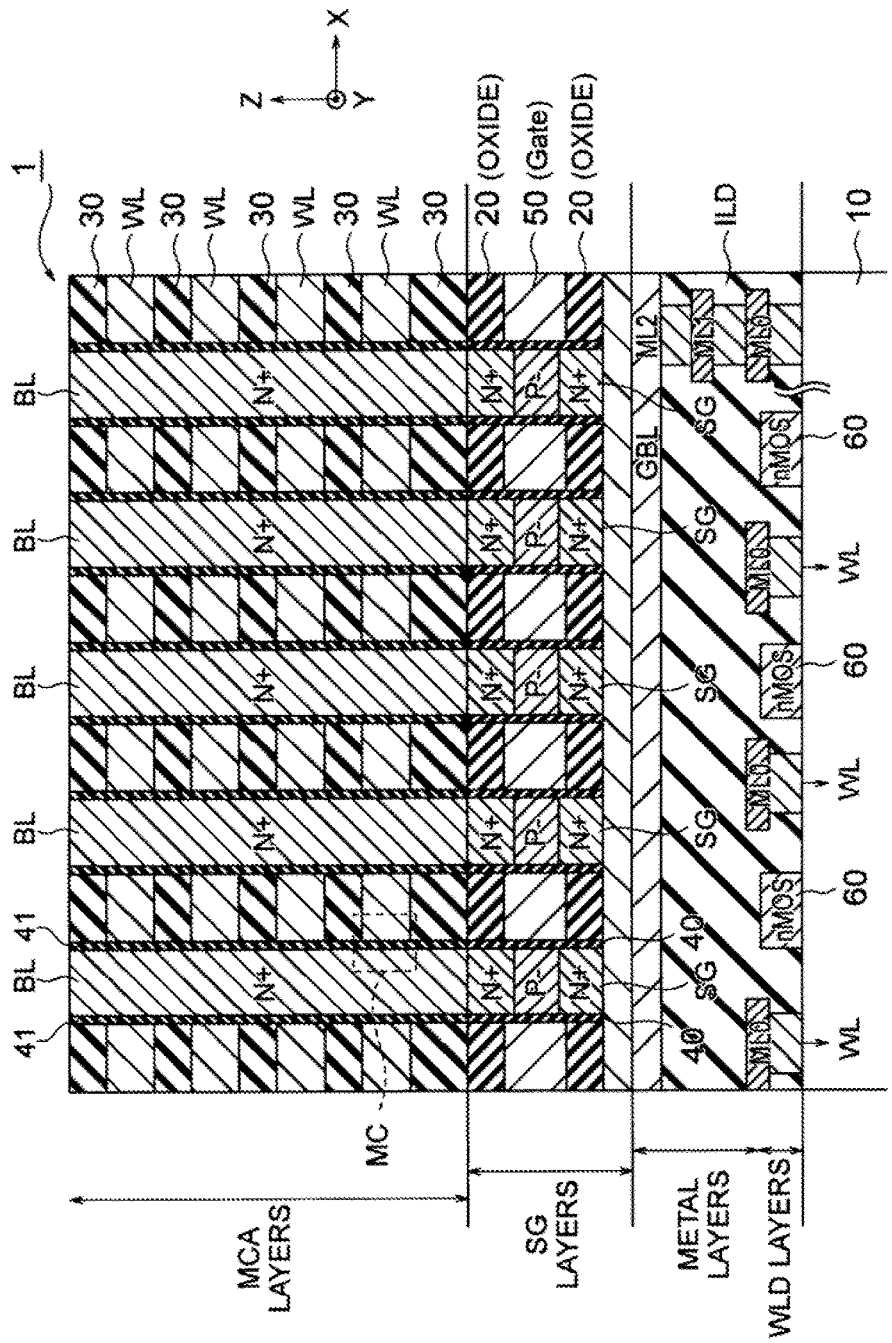
FIG. 1 is a cross-sectional view depicting aspects of a semiconductor memory according to an embodiment.

In general, according to one embodiment, a semiconductor memory device includes a plurality of memory cell arrays. The memory cell arrays include a plurality of memory cells. The memory cells are between first wirings extending in a first direction and second wirings extending in a second direction intersecting the first direction. A first control circuit includes a plurality of control transistors of a first conductivity type and is disposed in a first region directly below the plurality of memory cell arrays in the second direction. The control transistors are each electrically connected to a first wiring in the plurality of first wirings and configured to supply a voltage to the first wiring. A second control circuit includes a first transistor of a first conductivity type that is connected in parallel to a second transistor of a second conductivity type. An end of the first and second transistors are connected to an end of at least one control transistor in the plurality. The second control circuit is configured to deliver a voltage to the plurality of control transistors for application to the first wirings. The first transistor is disposed in the first region. The second transistor is disposed in a second region adjacent to the first region. The second region is disposed below a gap between adjacent memory cell arrays in the plurality of memory cell arrays.

Hereinafter, example embodiments of the present disclosure will be described with reference to the drawings. The present disclosure is not limited to these example embodiments. The drawings are schematic or conceptual and a ratio of each portion may not be the same as the actual ratio. In the present specification and the drawings, the same reference numerals are given to the same elements and the detailed description thereof will be appropriately omitted.

FIG. 1 is a sectional view illustrating a configuration example of a semiconductor memory according to an embodiment. The semiconductor memory according to an embodiment may be a nonvolatile memory, such as a NAND-type electrically erasable and programmable read-only-memory (EEPROM), a resistive random access memory (ReRAM), a phase-change random access memory (PCRAM), or a magnetoresitive random access memory (MRAM).

A semiconductor memory 1 includes a semiconductor substrate 10, a plurality of word lines WL, a plurality of bit lines BL, a plurality of memory cells MC, selection gates SG, a global bit line GBL, and a word line driver WLD.

The semiconductor substrate 10 is, for example, a silicon substrate. A memory cell array MCA (see FIG. 5) is formed on the semiconductor substrate 10. The memory cell array MCA includes a plurality of memory cells MC disposed at the intersections of the word lines WL and the bit lines BL. The memory cells MC are arranged 3-dimensionally.

Above the semiconductor substrate 10, the word lines WL, serving as first wirings, are stacked in a plurality of layers in a substantially vertical direction (denoted as the Z direction) to the surface of the semiconductor substrate 10. Insulating films 30 are formed between the word lines WL adjacent to each other in a stacking direction (the Z direction) and the word lines WL in different layers are electrically insulated from each other. That is, the word lines WL and the insulation films 30 are alternately stacked in the Z direction. The word lines WL in each layer extend in a substantial parallel direction (the Y direction) to the surface of the semiconductor substrate 10. For the word lines WL, a conductive material such as doped polysilicon or metal is used, for example. The insulation film 30 is, for example, a silicon oxide film.

The bit lines BL, serving as second wirings, extend in a substantially vertical direction to the surface of the semiconductor substrate 10 and are formed to intersect the word lines WL in the plurality of layers. For the bit lines BL, a conductive material such as $n^+$-type doped polysilicon is used, for example.

A variable resistance material 41, also referred to as a charge trap layer 41 in some context, is formed between the word line WL and the bit line BL. The memory cell MC includes the word line WL, the bit line BL, and the variable resistance material 41 between the word line WL and the bit line BL. For the variable resistance material 41, a transition metal oxide such as a hafnium oxide is used, for example.

The selection gate SG is formed between the bit lines BL and the global bit line GBL. The selection gate SG is an n type transistor and is switched between a conductive state and a non-conductive state when a voltage is applied to the gate electrode 50 formed with an insulating film 40 interposed therebetween. The selection gate SG can selectively connect the corresponding bit line BL to the global bit line GBL.

The global bit line BGL is formed in common to correspond to the plurality of bit lines BL arrayed in the X direction. The global bit line GBL is formed by a metal layer ML2 and an n$^+$-type polysilicon. The global bit line GBL is connected to a bit line driver (not illustrated) via the semiconductor substrate 10. Thus, a voltage necessary for a read or write operation can be applied to the global bit line GBL.

In the semiconductor substrate 10 immediately below the memory cell array MCA, the word line driver WLD, serving as a first control circuit, is formed. The word line driver WLD includes a plurality of n type control transistors 60 respectively connected to the plurality of word lines WL, and selectively drives the word lines WL. That is, the word line driver WLD can apply a voltage necessary for a read or write operation to any desired word line WL via the operation of a n type control transistor 60.

Figure 2:
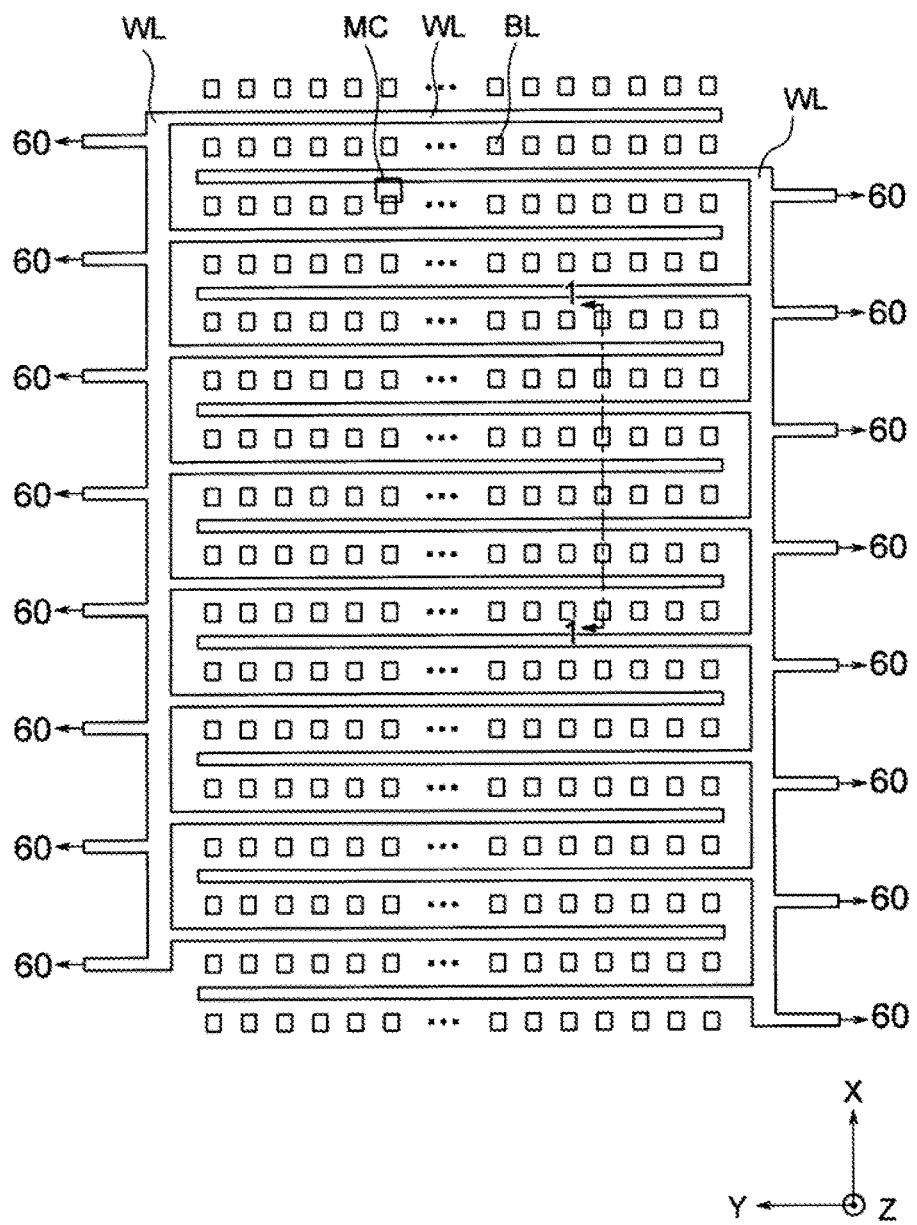
FIG. 2 is a plan view depicting aspects of a memory cell array.

FIG. 2 is a plan view illustrating a configuration example of the memory cell array MCA. A cross section taken along the line 1-1 of FIG. 2 corresponds to the cross sectional view of FIG. 1. FIG. 2 illustrates a planar, overhead layout of the word lines WL and the bit lines BL.

The bit lines BL are arranged in a matrix in the X-Y plane (that is, a plane parallel to the surface of the semiconductor substrate 10). The word line WL has a comb-like shape in which a plurality of branches extend from a root portion in the Y direction. One branch of the word line WL is formed between the bit lines BL adjacent in the X direction. Each of the intersections of the word line WL branches and the bit lines BL corresponds to a memory cell MC. Hereinafter, the word line WL having the comb-like shape is referred to simply as a "comb." The plurality of combs belonging to the device same layer form one word line layer. Each comb is connected to one control transistor 60 in the word line driver WLD and the same voltage is applied to each comb.

Figure 3:
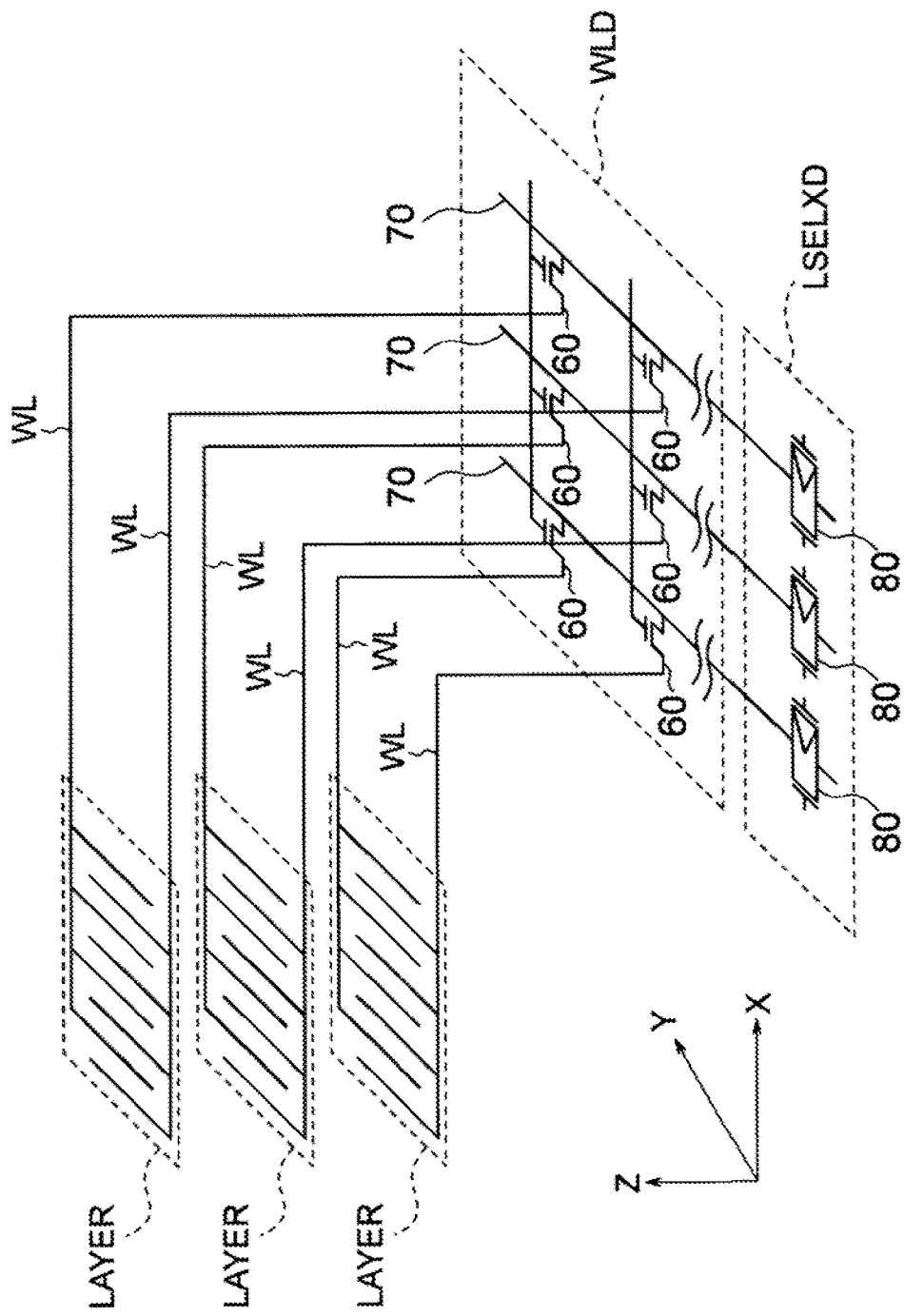
FIG. 3 is a schematic diagram illustrating configurational aspects of word lines, a word line driver, and a selection driver.

FIG. 3 is a schematic diagram illustrating a configuration example of the word lines WL, the word line driver WLD, and a selection driver LSELXD. In general, a plurality of combs are formed in each layer. In FIG. 3, two combs are depicted as formed in each layer, but the number of combs formed in each layer may be more than two.

The word lines WL (the combs) are each connected to a selection line 70 via a control transistor 60. In FIG. 3, to facilitate understanding, all of the combs in the same layer are depicted as connected to just one selection line 70. However, as a plurality of combs in the same layer can be formed in some cases, the combs in the same layer can be connected to different selection lines 70. In this case, each selection line 70 would function to select only some of the combs in a layer.

The selection line 70 is connected to the selection driver LSELXD. The selection driver LSELXD includes a plurality of complementary metal-oxide semiconductor (CMOS) gates 80. Each CMOS gate 80, serving as a second control circuit, is connected to a selection line 70, and thus can selectively transfer a voltage, such as a write voltage Vprog, to the corresponding selection line 70.

Figure 4:
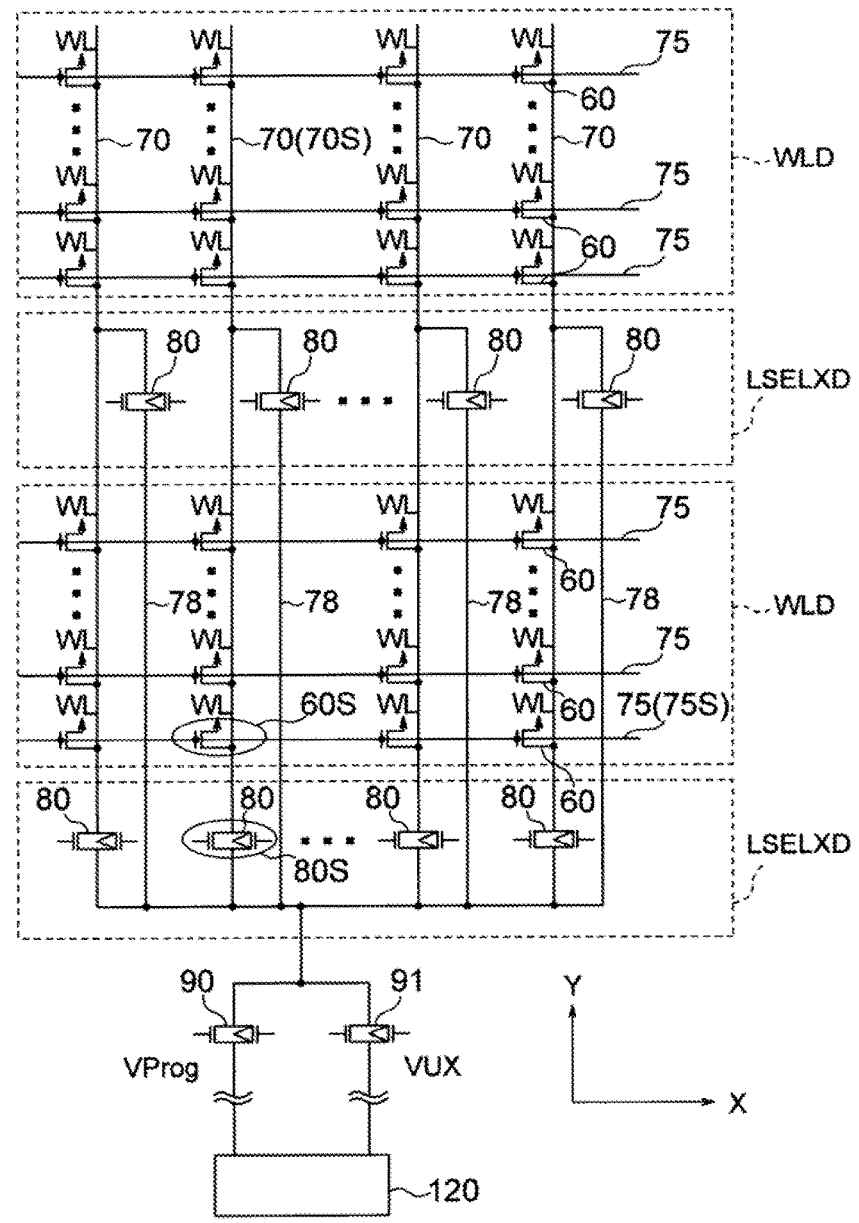
FIG. 4 is a circuit diagram illustrating additional aspects of a word line driver and a selection driver.

FIG. 4 is a circuit diagram illustrating a more detailed configuration of the word line driver WLD and the selection driver LSELXD. The word line driver WLD and the selection driver LSELXD illustrated in FIG. 4 are drivers corresponding to one layer.

In FIG. 3, three layers are depicted and two combs are depicted in each layer. Accordingly, there are two control transistors 60 in each layer. However, when more combs are formed in a layer and more control transistors 60 would be provided in the word line driver WLD to correspond to the increased number of combs. In the word line driver WLD illustrated in FIG. 4, the number of control transistors 60 is the same as the number of combs in the layer. In FIG. 3, one selection line 70 and one CMOS gate 80 are depicted in the layer, that is, for two control transistors 60. As illustrated in FIG. 4, however, a plurality of selection lines 70 and the plurality of CMOS gates 80 may be formed in one layer.

As illustrated in FIG. 4, the control transistors 60 corresponding to a certain layer are arranged 2-dimensionally in a matrix formed on the semiconductor substrate 10. One end (drain) of each of the control transistors 60 arrayed in the column direction (for example, the Y direction) is connected in common to the selection line 70. The other end (source) of each of the control transistors 60 arrayed in the Y direction is connected to a different word line WL (comb). Gate electrodes of the control transistors 60 arrayed in the row direction (for example, the X direction) are connected in common to a gate selection line 75.

The CMOS gates 80 are connected in common to the drains of the control transistors 60 arrayed in the Y direction via the selection line 70 and a program voltage Vprog or a non-selection voltage VUX are delivered to the drains of the control transistors 60.

The plurality of CMOS gates 80 are connected in parallel to one selection line 70. One of the plurality of CMOS gates 80 is connected to one end of the selection line 70 and another of the CMOS gates 80 is connected to a midway point (midpoint) of the selection line 70. When a voltage is applied from only one end of the selection line 70 in the CMOS gate 80, it takes some time to drive the control transistor 60 and the word lines WL (combs) connected to the other end of the selection line 70 due to parasitic capacitance of the control transistor 60. However, each of the plurality of CMOS gates 80 is connected to one end and the midway point of the selection line 70, and thus the selection line 70 can be at a desired voltage after a short time. That is, by connecting the plurality of CMOS gates 80 as buffers to correspond to one selection line 70, it is possible to drive the voltage of the selection line 70 rapidly.

In FIG. 4, the number of word line drivers WLD and the number of selection drivers LSELXD is the same as the number of layers formed on the semiconductor substrate 10. Common CMOS gates 90 and 91 are connected to the word line driver WLD and the selection driver LSELXD. The CMOS gate 90 is a gate that delivers the program voltage Vprog to be applied to the selection word line WL to the selection driver LSELXD in a data write operation. The CMOS gate 91 is a gate that delivers the non-selection voltage VUX to be applied to an unselected word line WL to the selection driver LSELXD in a data write operation. One pair of CMOS gates 90 and 91 corresponds to each layer. The number of pairs of CMOS gates 90 and 91 is the same as the number of layers formed on the semiconductor substrate 10. The CMOS gates 90 and 91 are connected to a power source 120, and thus deliver the program voltage Vprog or the non-selection voltage VUX from the power source 120 to the selection driver LSELXD. The power source 120 is configured to generate an internal voltage such as the program voltage Vprog and the non-selection voltage VUX from an external power source.

The word line driver WLD and the selection driver LSELXD having such configurations can selectively drive certain word line WL (comb) in one layer. For example, it is assumed that a particular control transistor 60S is selected and the program voltage Vprog is applied to the word line WL (comb) connected to this control transistor 60S. In this case, the CMOS gate 90 and the CMOS gate 80S enter a conductive state, and thus the program voltage Vprog is delivered to a selection line 70S. On the other hand, the CMOS gates 80 other than the CMOS gate 80S are in a non-conductive state and the CMOS gate 91 is also in a non-conductive state. A high-level voltage is applied to a particular gate selection line 75S. On the other hand, the gate selection lines 75 other than the gate selection line 75S enter an electrically floating state. The control transistor 60S enters a conductive state and connects the selection line 70S to the selected word line WL, so that the program voltage Vprog is applied to the selected word line WL. The control transistors 60 other than the particular control transistor 60S enter the non-conductive state. In this way, the word line driver WLD and the selection driver LSELXD can selectively apply the program voltage Vprog or the non-selection voltage VUX to one word line WL (comb). The non-selection voltage VUX is applied to the unselected layers.

Figure 5:
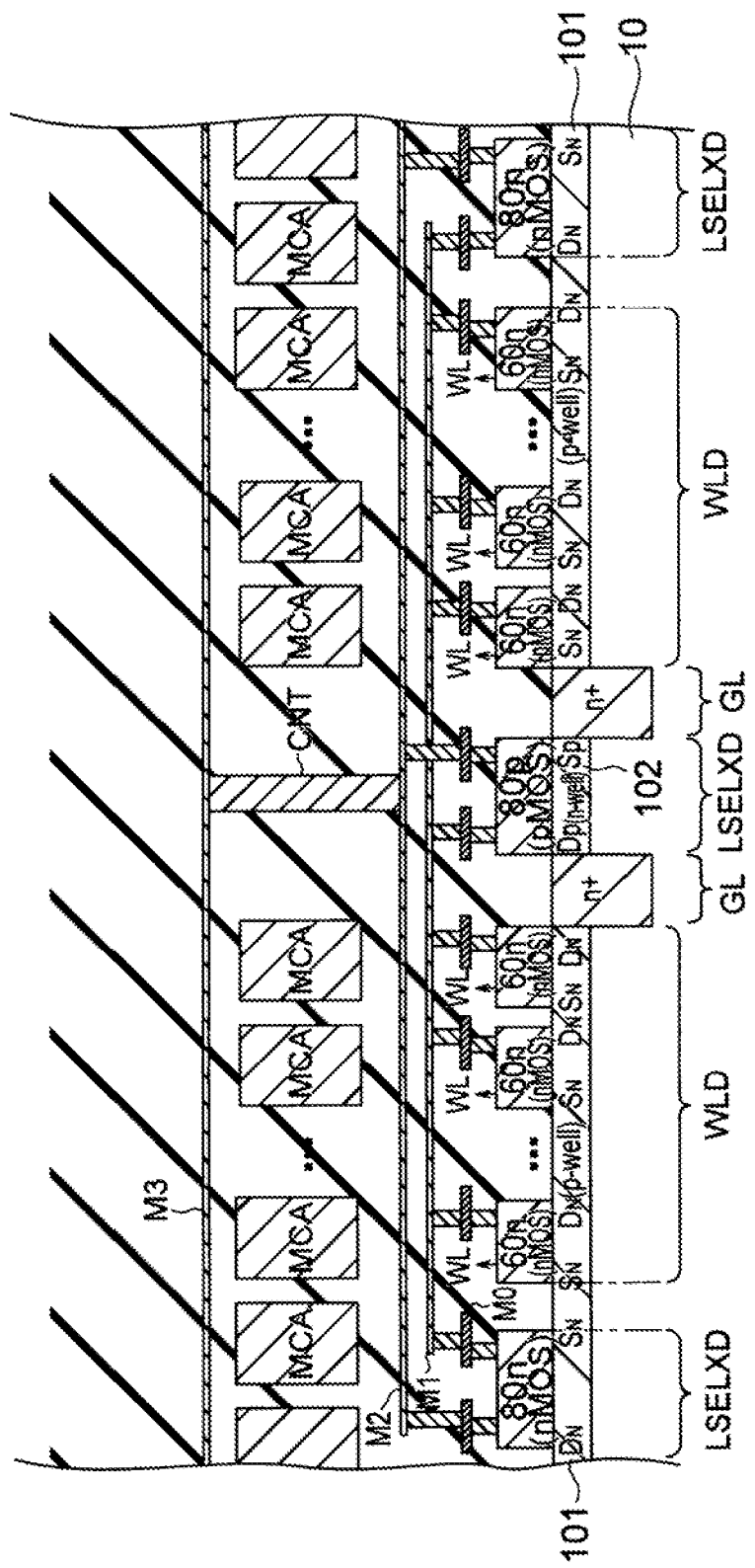
FIG. 5 is a cross-sectional view illustrating additional configurational aspects of a word line driver, a selection driver, and a memory cell array according to an embodiment.

FIG. 5 is a sectional view illustrating a more detailed configuration of the word line driver WLD, the selection driver LSELXD, and the memory cell array MCA according to an embodiment.

The memory cell arrays MCA are schematically illustrated on the semiconductor substrate 10. The word line drivers WLD and the selection drivers LSELXD are formed on the semiconductor substrate 10 immediately below the memory cell arrays MCA.

The control transistor 60 in the word line driver WLD is configured as an n type metal oxide semiconductor field-effect transistor (MOSFET). On the other hand, the CMOS gate 80 is formed by an n type MOSFET serving as a first transistor and a p type MOSFET serving as a second transistor connected in parallel to each other. Hereinafter, the n type MOSFET of the control unit 60 is referred to as 60$n$. The n type MOSFET of the CMOS gate 80 is referred to as 80$n$ and the p type MOSFET of the CMOS gate 80 is referred to as 80$p$. The n type MOSFETs 60$n$ and 80$n$ are formed in a p type well 101 of a surface region of the semiconductor substrate 10. The n type MOSFETs 60$n$ and 80$n$ include an n$^+$-type source layer Sn and an n$^+$-type drain layer Dn formed in the p type well. The p type MOSFET 80$p$ is formed in an n type well 102 formed in a surface region of the semiconductor substrate 10. The p type MOSFET 80$p$ includes a p$^+$-type source layer Sp and a p$^+$-type drain layer Dp formed in the n type well. The p type well 101 and the n type well 102 are electrically isolated from each other by a guard ring GL. The guard ring GL is a contact region that takes the substrate potential and is an n$^+$layer surrounding the n-type well 102. The guard ring GL is greater in width than a shallow trench isolation (STI) feature and has a relatively large layout area. The STI feature is formed between the n-type MOSFETs 60$n$ and 80$n$, but is not specifically illustrated in FIG. 5 (but see FIG. 6B).

In an embodiment, the n-type MOSFET 60$n$ of the word line driver WLD is formed in a layout region between the n-type MOSFET 80$n$ and the p-type MOSFET 80$p$ of the CMOS gate 80. Accordingly, the n-type MOSFET 80$n$ and the p-type MOSFET 80$p$ of the CMOS gate 80 are spatially separated from each other and are not directly adjacent. However, the n-type MOSFET 80$n$ and the p-type MOSFET 80$p$ may still be electrically connected in parallel to each other. Here, a first metal layer M1 and a second metal layer M2 are used to electrical connect the n-type MOSFET 80$n$ and the p-type MOSFET 80$p$ to each other.

The first metal layer M1 is connected in to the drains Dn of each n-type MOSFET 60$n$ (of the control transistors 60) as well as to a source Sn that serves as one end of the n-type MOSFET 80$n$ and a drain Dp serving as one end of the p-type MOSFET 80$p$.

The second metal layer M2 is used to connect the drain Dn of the n-type MOSFET 80$n$ to the source Sp of the p-type MOSFET 80$p$. The second metal layer M2 is connected to the drain Dn serving as the other end of the n-type MOSFET 80$n$ and the source Sp serving as the other end of the p-type MOSFET 80$p$.

In this way, the source Sn of the n-type MOSFET 80$n$ and the drain Dp of the p-type MOSFET 80$p$ are connected by the first metal layer M1, and the drain Dn of the n-type MOSFET 80$n$ and the source Sp of the p-type MOSFET 80$p$ are connected by the second metal layer M2. Thus, the n-type MOSFET 80$n$ and the p-type MOSFET 80$p$ are electrically connected in parallel to each other and function as CMOS gate 80.

Furthermore, the second metal layer M2 is connected to a third metal layer M3 disposed above the memory cell array MCA with a contact CNT. The third metal layer M3 above the memory cell array MCA can be wide and is thus generally connected with a resistance less than is the case with the second metal layer M2 used in connecting the CMOS gates 90 and 91 in FIG. 4. Accordingly, the second metal layer M2 is connected to the voltage source 120 (see FIG. 4) via the third metal layer M3 above the memory cell array MCA. In the metal layers M0 to M3, for example, a conductive material such as copper, aluminum, or doped polysilicon is used.

Here, the n-type MOSFET 80$n$ and the p-type MOSFET 80$p$ of the selection driver LSELXD are electrically connected in parallel, but are not physically adjacent to each other, and are formed on the semiconductor substrate 10 immediately below the memory cell array MCA together with the n-type MOSFET 60$n$ of the word line driver WLD. The p-type MOSFET 80$p$ is formed below a gap between adjacent word line drivers WLD and can be formed on the semiconductor substrate 10 immediately below the contact CNT in FIG. 5.

The reason for such disposition is as follows.

Normally, to reduce the number of metal wiring layers and shorten metal wiring lengths, an n-type MOSFET and a p-type MOSFET of a CMOS gate of the selection drivers LSELXD are designed to be disposed to be directly adjacent to each other. In such a case, the word line driver WLD would be disposed immediately below the memory cell array MCA and a CMOS gate of the selection driver LSELXD would be disposed below a gap between the adjacent memory cell arrays MCA. However, a guard ring GL may be disposed between the n-type MOSFET and the p-type MOSFET of the CMOS gate. For example, when the n-type MOSFET and the p-type MOSFET are directly adjacent in the selection driver LSELXD, the guard ring GL may be formed inside rather than outside of the perimeter circumference of the selection driver LSELXD. In this case, the area occupied by the selection driver LSELXD increases by occupied area of the guard ring GL.

According to the present embodiment, however, the p-type MOSFET 80p of the CMOS gate 80 is formed below the gap between the adjacent memory cell arrays MCA, but the n-type MOSFET 80n is formed in the p-type well 101 like the n-type MOSFET 60n of the word line driver WLD. Accordingly, the guard ring GL may be formed surrounding the selection driver LSELXD, but need not be formed inside the selection driver LSELXD itself. Since the guard ring GL need not be formed inside the selection driver LSELXD, the layout area required for the selection driver LSELXD decreases On the other hand, the n-type MOSFET 60n of the word line driver WLD is formed to correspond to the memory cell array MCA. Accordingly, when a n-type MOSFET 80n is locally formed at a location inside the word line driver WLD, the n-type MOSFET 60n may not be disposed to correspond to the memory cell array MCA. Accordingly, the n-type MOSFETs 80n are distributed to be disposed at a plurality of locations inside the word line driver WLD. Thus, the n-type MOSFET 80n can be embedded in the word line driver WLD without considerably changing the disposition of the n-type MOSFET 60n of the word line driver WLD or the layout area of the word line driver WLD. The distributed disposition of the n-type MOSFETs 80n will be described below with reference to FIG. 7.

In the semiconductor memory 1 according to the present embodiment, the layout area of the selection driver LSELXD can be reduced without increasing the layout area of the word line driver WLD. As a result, it is possible to reduce the total occupied area of the semiconductor memory 1.

Figure 6A:
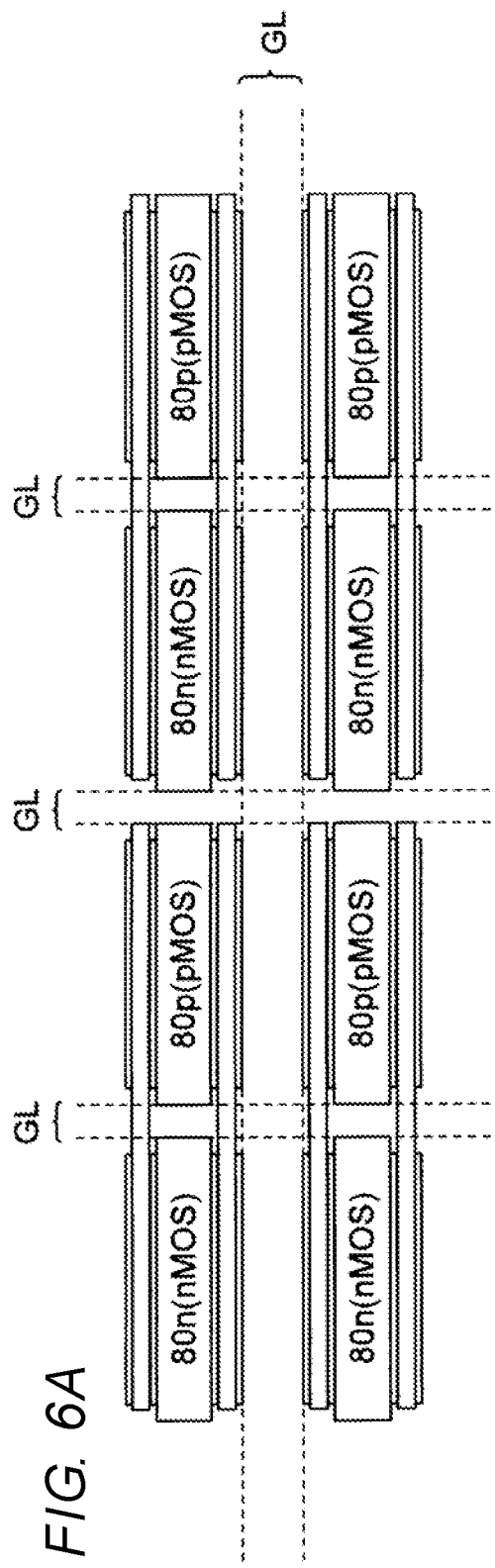
FIGS. 6A and 6B are plan views illustrating a portion of a layout of a selection driver.
Figure 6B:
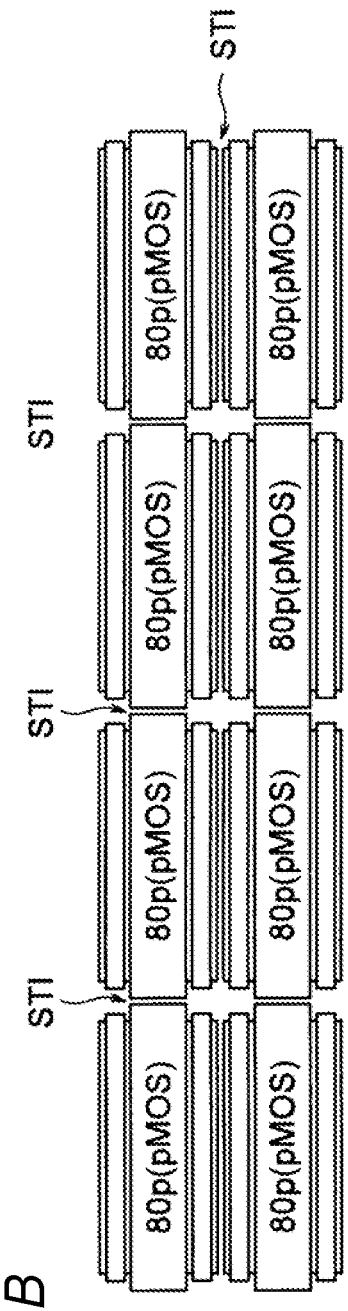

For example, FIGS. 6A and 6B are plan views illustrating a part of the layout of the selection driver LSELXD. In FIG. 6A, all the n-type MOSFETs 80n and the p-type MOSFETs 80p of the CMOS gates 80 are formed below gaps between the adjacent memory cell arrays MCA. In this case, the guard ring GL may be formed between the n-type MOSFET 80n and the p-type MOSFET 80p and an interval between the n-type MOSFET 80n and the p-type MOSFET 80p may be enlarged.

On the other hand, in FIG. 6B, the p-type MOSFETs 80p of the CMOS gates 80 are formed below the gaps between the adjacent memory cell arrays MCA, the n-type MOSFETs 80n are distributed in the word line driver WLD, as described above. The n-type MOSFETs 80n are not specifically depicted in FIG. 6B. In this case, since only the p-type MOSFETs 80p are disposed in regions below the gaps between the adjacent memory cell arrays MCA, the guard ring GL need not be formed in the selection driver LSELXD. A STI feature with a width narrower than the guard ring GL may be formed between the adjacent p-type MOSFETs 80p. Accordingly, as understood in comparison between FIGS. 6A and 6B, the layout area of the selection driver LSELXD according to the present embodiment can be reduced.

The word line driver WLD is formed immediately below the memory cell array MCA and the area of the word line driver WLD depends on the area of the memory cell array MCA. That is, a chip size of the semiconductor memory 1 may not be reduced even when the area of the word line driver WLD is reduced as much as possible, so long as the area of the word line driver WLD is less than the area of the memory cell array MCA. In contrast, by embedding the n-type MOSFET 80n of the selection driver LSELXD in area otherwise occupied by the word line driver WLD, the chip size of the semiconductor memory 1 is not changed even though the area of the word line driver WLD increases somewhat, because even though increased the area of the word line driver WLD is still less than the area of the memory cell array MCA.

However, the selection driver LSELXD is formed below the gap between the adjacent word line drivers WLD. Accordingly, when the selection driver LSELXD is reduced in size, the size of the semiconductor memory 1 can be reduced to the same extent. That is, when the area of the selection driver LSELXD is reduced by embedding the n-type MOSFET 80n of the selection driver LSELXD in the word line driver WLD, the chip size of the semiconductor memory 1 can be reduced by an amount corresponding to the reduction in size of the selection driver LSELXD.

Figure 7:
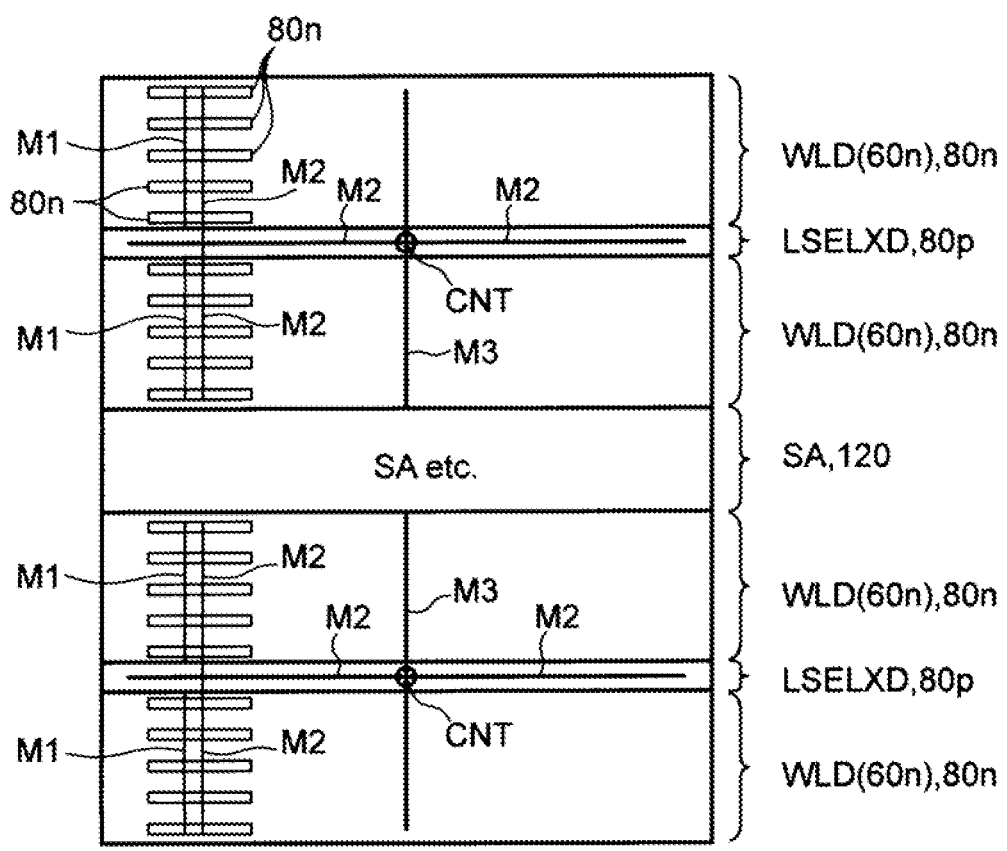
FIG. 7 is a diagram illustrating a layout of a word line driver and a selection driver according to an embodiment.

FIG. 7 is a diagram illustrating an example of the layout of the word line driver WLD and the selection driver LSELXD according to the present embodiment. The word line driver WLD and the selection driver LSELXD are formed on both sides of a region in which a sense amplifier SA is formed.

The p-type MOSFET 80p of the selection driver LSELXD is formed in the selection driver LSELXD area. However, the n-type MOSFET 60n of the word line driver WLD and the n-type MOSFET 80n of the selection driver LSELXD are formed in the word line driver WLD area. The n-type MOSFETs 80n of the selection drivers LSELXD are divided into a plurality of pairs of MOSFETs 80n and are distributed at a substantially equal interval in the word line drivers WLD, as illustrated in FIG. 7.

The sense amplifier SA delivers the program voltage Vprog or the non-selection voltage VUX from the voltage source 120 (see FIG. 4) to the third metal layer M3. At this time, the program voltage Vprog or the non-selection voltage VUX is delivered to the third metal layer M3 via the CMOS gate 90 or 91. The third metal layer M3 extends from both sides of the sense amplifier SA and is connected to the second metal layer M2 via the contact CNT.

The second metal layer M2 extends in the selection driver LSELXD and is connected to the p-type MOSFET 80p. Furthermore, the second metal layer M2 also extends in the word line driver WLD and is also connected to the n-type MOSFET 80n in the word line driver WLD. The second metal layer M2 in the selection driver LSELXD region may be a metal layer different from the second metal layer M2 in the word line driver WLD region. In this case, the metal layer in the selection driver LSELXD region and the metal layer in the word line driver WLD region may be connected to a contact plug.

The first metal layer M1 extends in the word line driver WLD region and is connected to the n-type MOSFETs 60n and 80n in the word line driver WLD.

Thus, the sense amplifier SA applies the program voltage Vprog or the non-selection voltage VUX to the selection driver LSELXD and the word line driver WLD via the first to third metal layers M1 to M3. Further, the word line driver WLD and the selection driver LSELXD can apply the program voltage Vprog or the non-selection voltage VUX to the word lines WL connected to the n-type MOSFETs 60n.

As described above, according to the present embodiment, the p-type MOSFET 80p of the CMOS gate 80 is formed below the gap between the adjacent memory cell arrays MCA, but the n-type MOSFET 80n is formed in the p-type well 101 along with the n-type MOSFET 60n. Accordingly, the guard ring GL is formed surrounding the selection driver LSELXD region, but need not be formed in the selection driver LSELXD region. Even if the area occupied by the word line driver WLD region somewhat, there is no influence on the chip size of the semiconductor memory 1 so long as the world line driver WLD region remains less than or equal to the area of the memory cell array MCA. Accordingly, in the semiconductor memory 1 according to the present embodiment, the layout area of the selection driver LSELXD can be reduced without substantially increasing the layout area of the word line driver WLD. As a result, it is possible to reduce the chip size of the entire semiconductor memory 1.

In the foregoing embodiment, the n-type MOSFETs 80$n$ of the CMOS gates 80 are distributed in the word line drivers WLD region. However, when the word line driver WLD is configured with a p-type MOSFET, the p-type MOSFETs 80$p$ of the CMOS gates 80 may be distributed t in the word line drivers WLD region instead.

For example, when a circuit is a circuit formed in a lower layer of the memory cell array MCA as in a write control circuit, a sense amplifier circuit, or the like, the first conductivity type transistor may be disposed immediately below the memory cell array together with the first control circuit and the second conductivity type transistor may be disposed between the adjacent memory cell arrays MCA on the semiconductor substrate 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of memory cell arrays that include a plurality of memory cells between a plurality of first wirings extending in a first direction and a plurality of second wirings extending in a second direction intersecting the first direction;
a first control circuit including a plurality of control transistors of a first conductivity type disposed in a first region directly below the plurality of memory cell arrays and one of the control transistors electrically connected to a first wiring of the plurality of first wirings and configured to supply a voltage to the first wiring; and
a second control circuit including a first transistor of a first conductivity type connected in parallel to a second transistor of a second conductivity type, an end of the first and second transistors being connected to an end of at least one control transistor in the plurality, the second control circuit being configured to deliver a voltage to the plurality of control transistors for application to the first wirings, wherein
the first transistor is disposed in the first region,
the second transistor is disposed in a second region adjacent to the first region, the second region being below a gap between adjacent memory cell arrays in the plurality of memory cell arrays, and
a vertical contact is disposed in the gap, the vertical contact being electrically connected to the second control circuit.

2. The semiconductor memory device according to claim 1, wherein the first transistor shares a source region with at least one control transistor in the first control circuit.

3. The semiconductor memory device according to claim 1, wherein the second control circuit is a CMOS gate.

4. A semiconductor memory device, comprising:
a plurality of memory cell arrays that include a plurality of memory cells between a plurality of first wirings extending in a first direction and a plurality of second wirings extending in a second direction intersecting the first direction;
a first control circuit including a plurality of control transistors of a first conductivity type disposed in a first region directly below the plurality of memory cell arrays and one of the control transistors electrically connected to a first wiring of the plurality of first wirings and configured to supply a voltage to the first wiring; and
a second control circuit including a first transistor of a first conductivity type connected in parallel to a second transistor of a second conductivity type, an end of the first and second transistors being connected to an end of at least one control transistor in the plurality, the second control circuit being configured to deliver a voltage to the plurality of control transistors for application to the first wirings, wherein
the first transistor is disposed in the first region,
the second transistor is disposed in a second region adjacent to the first region, the second region being below a gap between adjacent memory cell arrays in the plurality of memory cell arrays,
each first wiring is connected to the one control transistor in the first control circuit on a first end of the control transistor,
a second end of the control transistor is connected to first ends of the first and second transistors via a first metal layer disposed at a level below the plurality of memory cell arrays, and
second ends of the first and second transistors are connected to each other via a second metal layer disposed at a level above the first metal layer.

5. The semiconductor memory device according to claim 4, wherein the second metal layer is connected to a power source via a third metal layer disposed above the plurality of memory cell arrays.

6. The semiconductor memory device according to claim 5, wherein an electrical resistance of the third metal layer is less than an electrical resistance of the second metal layer.

7. The semiconductor device according to claim 1, further comprising a guard layer between the first region and the second region.

8. The semiconductor device according to claim 1, wherein the first region is comprises a p-well region of a semiconductor substrate, and the second region comprises an n-well region of the semiconductor substrate.

9. The semiconductor device according to claim 1, wherein the first control circuit is a word line driver circuit, and the second control circuit is a selection driver circuit.

10. The semiconductor device according to claim 1, wherein the plurality of memory cells are variable resistance type memory cells.

11. The semiconductor device according to claim 1, wherein the first conductivity type is n-type and the second conductivity type is p-type.

12. A semiconductor memory device, comprising:
a first memory cell array on a semiconductor substrate;
a second memory cell array on the semiconductor substrate adjacent to the first memory cell array;
a first control circuit on the substrate in a first region directly below the first memory cell array, the first control circuit including a control transistor having a first end connected to a word line of the first memory cell array;

a second control circuit comprising a complementary transistor pair including a first transistor of a first conductivity type and a second transistor of a second conductivity type connected in parallel, a first end of the complementary pair being connected to a second end of the control transistor, the first transistor being disposed in the first region, the second transistor being disposed in a second region of the substrate, the second region being below a gap between the first and second memory cell arrays; and a vertical contact disposed in the gap, the vertical contact being electrically connected to the second control circuit.

13. A semiconductor memory device, comprising:

a first memory cell array on a semiconductor substrate;

a second memory cell array on the semiconductor substrate adjacent to the first memory cell array;

a first control circuit on the substrate in a first region directly below the first memory cell array, the first control circuit including a control transistor having a first end connected to a word line of the first memory cell array;

a second control circuit comprising a complementary transistor pair including a first transistor of a first conductivity type and a second transistor of a second conductivity type connected in parallel, a first end of the complementary pair being connected to a second end of the control transistor, the first transistor being disposed in the first region, the second transistor being disposed in a second region of the substrate, the second region being below a gap between the first and second memory cell arrays;

a first wiring level between the substrate and the first and second memory cell arrays, a wiring on the first wiring level connecting the second end of the control transistor and the first end of the complementary pair; and a second wiring level between the first wiring level and the first and second memory cell arrays, a wiring on the second wiring level connecting ends of the first and second transistors to form a second end of the complementary pair.

14. The semiconductor device according to claim 12, wherein the control transistor is between the first transistor and the second transistor.

15. The semiconductor device according to claim 12, further comprising:

a guard layer in the substrate between the first and second regions, wherein the guard layer is between the first transistor and the second transistor.

16. The semiconductor device according to claim 12, wherein the first region is a p-well region and the second region is an n-well region.

* * * * *